US008824231B2

(12) United States Patent
Choi

(10) Patent No.: US 8,824,231 B2
(45) Date of Patent: Sep. 2, 2014

(54) REDUCED NOISE DRAM SENSING

(71) Applicant: MOSAID Technologies Incorporated, Ottawa (CA)

(72) Inventor: Byoung Jin Choi, Kanata (CA)

(73) Assignee: Conversant Intellectual Property Management Inc., Ottawa (CA)

( * ) Notice: Subject to any disclaimer, the term of this patent is extended or adjusted under 35 U.S.C. 154(b) by 29 days.

(21) Appl. No.: 13/644,528

(22) Filed: Oct. 4, 2012

(65) Prior Publication Data
US 2013/0083615 A1 Apr. 4, 2013

Related U.S. Application Data

(60) Provisional application No. 61/542,986, filed on Oct. 4, 2011.

(51) Int. Cl.
*G11C 7/00* (2006.01)
(52) U.S. Cl.
USPC .......................................... 365/203; 365/205
(58) Field of Classification Search
USPC .......................................... 365/203, 205, 63
See application file for complete search history.

(56) References Cited

U.S. PATENT DOCUMENTS

| 5,396,450 | A | 3/1995 | Takashima et al. |
| 5,761,109 | A | 6/1998 | Takashima et al. |
| 2010/0226192 | A1 | 9/2010 | Moon et al. |
| 2012/0063241 | A1* | 3/2012 | Kajigaya .................. 365/189.04 |

FOREIGN PATENT DOCUMENTS

WO  2011153608  12/2011

* cited by examiner

*Primary Examiner* — Huan Hoang
(74) *Attorney, Agent, or Firm* — Dennis R. Haszko

(57) ABSTRACT

A dynamic random access memory device is described. A first array has a first plurality of bitlines, each coupled to a column of memory cells. A second has a second plurality of bitlines, each coupled to a column of memory cells. Sense amplifiers are selectively connectable in an open bitline configuration to at least one bitline of the first plurality of bitlines and at least one complementary bitline of the second plurality of bitlines. A voltage supply having a voltage $V_{BL}$ corresponding to a bitline precharge voltage is selectively connectable to each bitline. Logic selectively connects each bitline and the complementary bitline to one of a sense amplifier and the voltage supply during a read operation. Each bitline connected to the sense amplifier is adjacent to a bitline concurrently connected to the voltage supply. A method is also described.

18 Claims, 10 Drawing Sheets

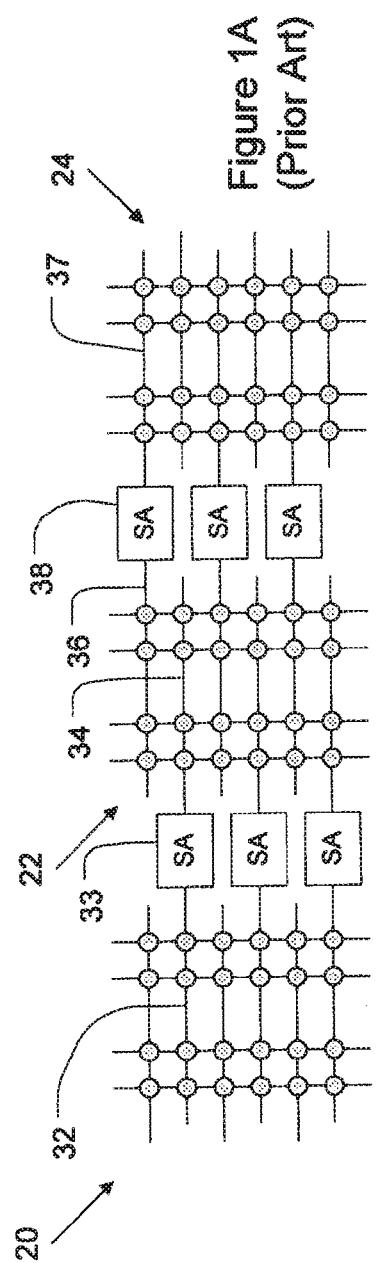
Figure 1A (Prior Art)
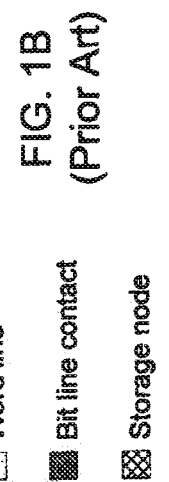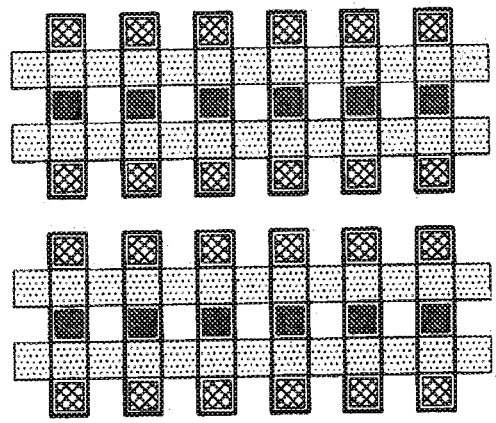
FIG. 1B (Prior Art)

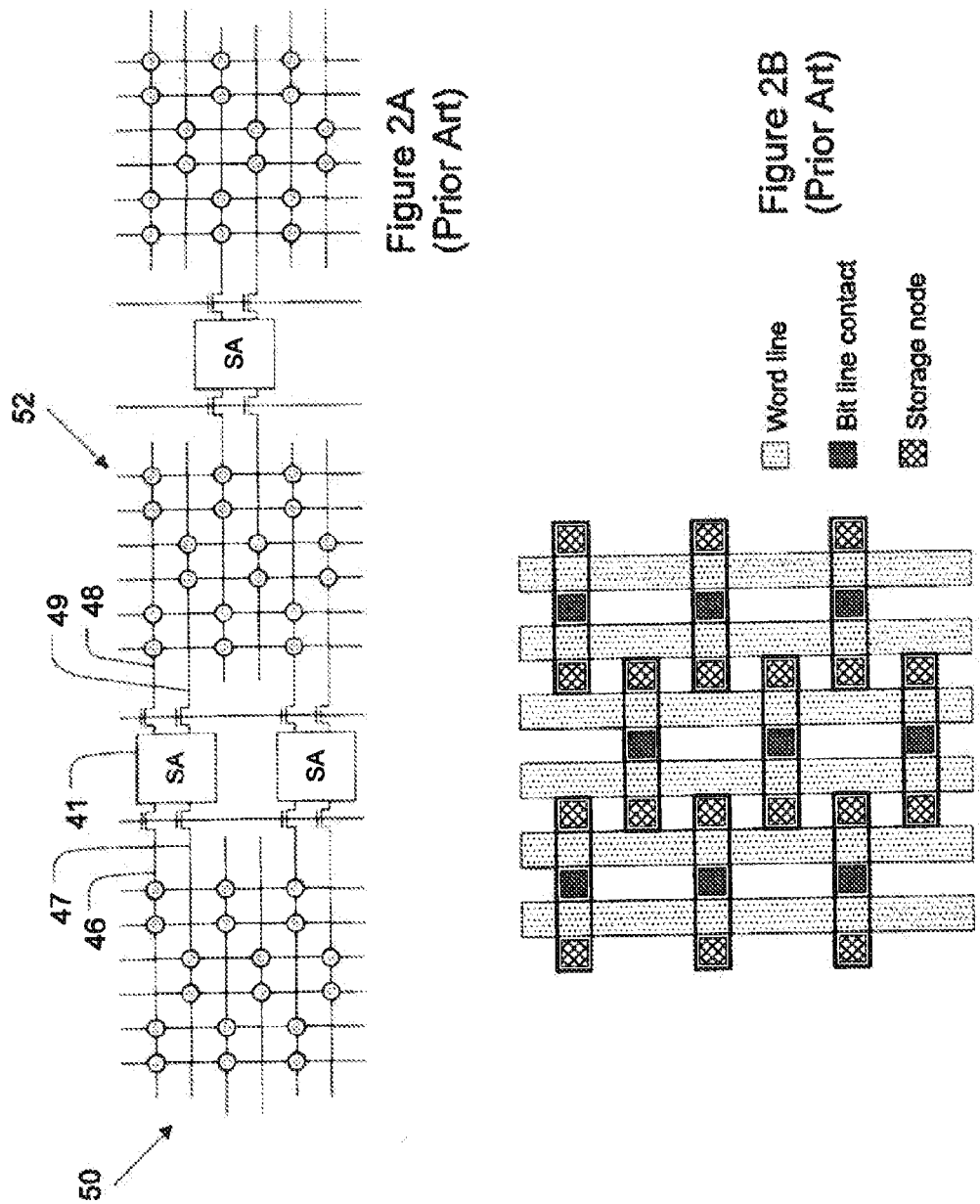

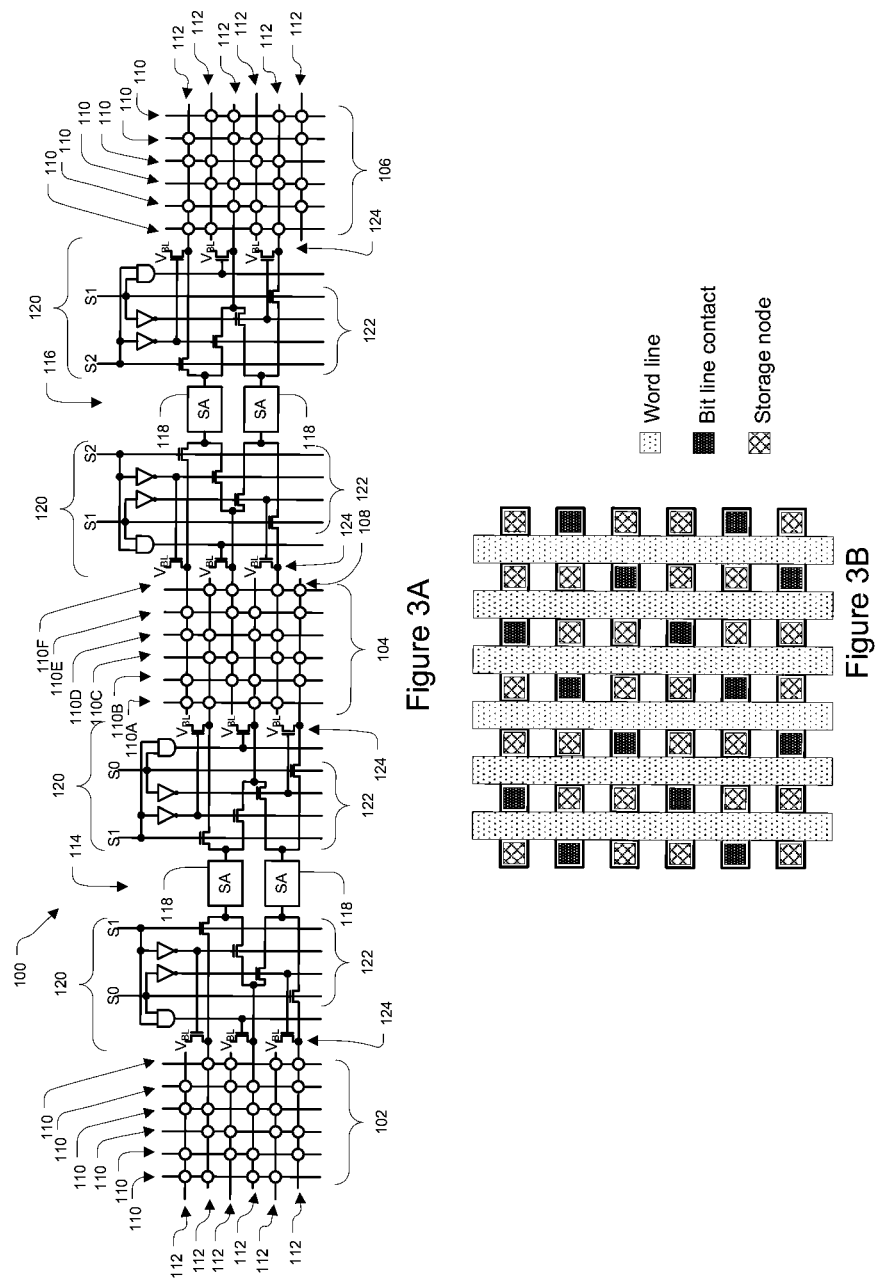

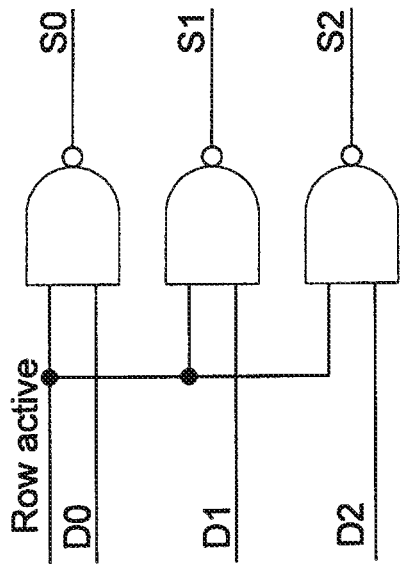
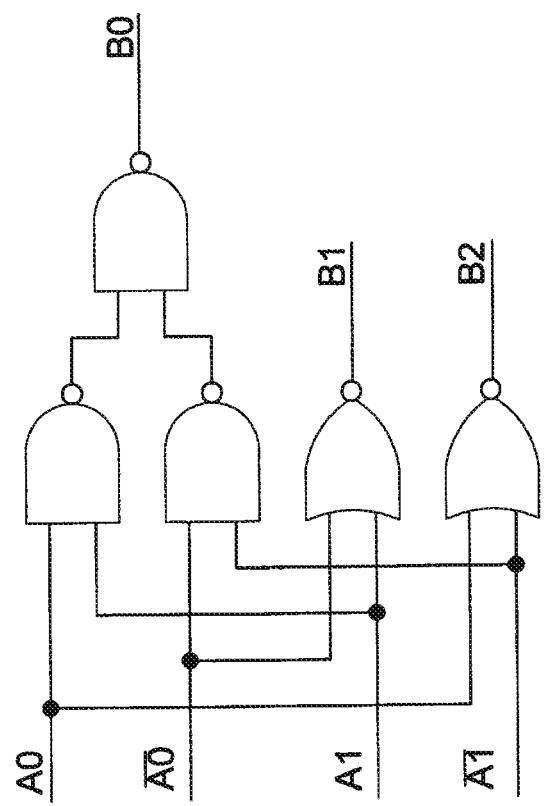

REDUCED NOISE DRAM SENSING

CROSS-REFERENCE TO RELATED APPLICATION AND CLAIM OF PRIORITY

The present application claims priority to U.S. Provisional Patent Application No. 61/542,986, filed on Oct. 4, 2011.

FIELD OF THE INVENTION

The invention relates generally to semiconductor memory devices, and more specifically to a method and apparatus for sensing in dynamic random access memory devices.

BACKGROUND

In many conventional memory systems, such as dynamic random access memory (DRAM), binary digits (bits) are stored in memory cells, and are accessed by a processor that specifies a linear address that is associated with the given cell. This system provides rapid access to any portion of the memory system. Within the field of DRAM, there exist two well-known architectures for arranging the memory cells and bitlines, each of which provides distinct advantages and disadvantages.

The first architecture is the open bitline architecture, generally shown in FIGS. 1A and 1B. The arrangement shown in FIG. 1A is representative of the physical layout of the memory cells, bitlines and wordlines with respect to the bitline sense amplifier on a fabricated device. Some circuitry is intentionally omitted to simplify the schematic. It should be understood by those skilled in the art that wordlines would run perpendicular to the bitlines, memory cells would be located near the intersection between each wordline and bitline, and read/write circuits are coupled to the bitlines. Complementary bitlines 32 and 34 extend away from the left and right sides of the bitline sense amplifier 33 into memory arrays 20 and 22 respectively. A bitline sense amplifier such as sense amplifier 33 is well known in the art and typically includes a cross-coupled complementary pair of CMOS transistors. An n-channel equalization transistor (not shown) is connected between bitlines 32 and 34 for electrically shorting the two bitlines together, and has a gate controlled by a bitline equalization signal BLEQ. Bitlines 32 and 34, equalization transistor and sense amplifier 33 form one open bitline pair. Another bitline pair consisting of bitlines 36 and 37, an equalization transistor (not shown) and sense amplifier 38 are configured identically to their corresponding elements from the first open bitline pair. In a memory device, a plurality of open bitline pairs are arranged one below the other as shown in FIG. 1A, in which all the bitlines connected to the left side of the sense amplifiers 33 are part of the left array 20 and all the bitlines connected to the right side of the sense amplifiers 33 are part of the right array 22. For DRAM memories, it is necessary to precharge bitlines prior to reading the stored data, through bitline precharge transistors (not shown), to a mid-point potential level $V_{BL}$, prior to reading data from a DRAM memory cell connected to it. This mid-point potential level is typically half the high power supply potential used by the bitline sense amplifiers. This is to allow the bitline sense amplifier to detect small changes in the potential level of the bitline when charge is added or removed by the memory cell storage capacitor. The bitlines may alternatively be precharged to the potential level $V_{BL}$ by coupling them to a voltage supply calibrated to the desired potential $V_{BL}$.

A read and precharge operation for the open bitline architecture of FIG. 1A will briefly be described. It is assumed that all bitlines have been precharged to a mid-point potential level $V_{BL}$ between a high and a low logic potential level in a previous operation. During a read operation, one wordline of either the left or right array is driven to access one memory cell connected to each bitline of the respective array. The bitlines of the unaccessed array remain at the mid-point potential level, which is the reference potential level used by the sense amplifier during sensing of the data on the bitlines of the accessed array. Alternatively, both arrays 20, 22 contain complementary data, in which case corresponding wordlines of both arrays 20, 22 are driven, and the potential of each pair of complementary bitlines changes in opposite directions, thereby increasing the shift in potential to be detected by the sense amplifier. The sense amplifier detects the shift in the potential level of the bitline when the storage capacitor of the accessed memory cell is coupled to the bitline, and amplifies and latches the full CMOS logic potential level of the bitline. Since sense amplifier is a cross-coupled latch circuit, the accessed bitline and its corresponding complementary bitline are driven to opposite logic potential levels after the data has been read out, and since the selected wordline remains activated, the full CMOS level is restored into each accessed cell. The bitlines are then precharged again in preparation for the next read operation.

The open bitline architecture allows for efficient packing of DRAM cells in a $6F^2$ cell design to reduce the overall area occupied by the memory array, as can be seen in FIG. 1B. However, when all of the bitlines of an array are sensed concurrently in a single read operation, the capacitative coupling between adjacent bitlines can generate crosstalk noise, particularly between adjacent bitlines sensing opposite potentials. This crosstalk can manifest itself, for example, if the rising potential on a bitline pulls up the falling potential on an adjacent bitline or vice versa, thereby interfering with the ability of the sense amplifier to quickly and accurately detect the bit to be read, resulting in increased access time and potential read errors. These errors can be mitigated to some extent by manufacturing the DRAM cells with larger capacitors capable of storing more charge. However, this has its own disadvantages, including increased power consumption and limiting the reduction in size of the DRAM array. Another disadvantage of the open bitline architecture is that each sense amplifier must fit within a two-bitline pitch, which can make the layout of the overall device challenging.

The second architecture is the folded bitline architecture, generally shown in FIGS. 2A and 2B. The arrangement shown in FIG. 2A is representative of the physical layout of the cells, bitlines and wordlines with respect to the bitline sense amplifier on a fabricated device. Some circuitry is intentionally omitted to simplify the schematic. It should be understood by those skilled in the art that wordlines would run perpendicular to the bitlines, memory cells would be located near the intersection between each wordline and bitline, and read/write circuits are coupled to the bitlines. Complementary bitlines 46 and 47 extend away from the left side of a shared bitline sense amplifier 41 into memory array 50, and complementary bitlines 48 and 49 extend away from the right side of sense amplifier 41 into memory array 52. A shared bitline sense amplifier such as sense amplifier 41 is well known in the art, and would typically consist of a pair of cross-coupled complementary pair of CMOS transistors. N-channel equalization transistors (not shown) are connected between bitlines 46 and 47 at opposite ends of bitlines 46 and 47. Similarly, n-channel equalization transistors (not shown) are connected between bitlines 48 and 49 at opposite ends of bitlines 48 and 49. Equalization transistors (not shown) for the left memory array 50 have gates controlled by a left array bitline equalization signal BLEQ_L, and equalization transistors (not shown) for the right memory array 52 have gates controlled by a right array bitline equalization signal BLEQ_R. In a typical array, a shared sense amplifier and respective pairs of folded bitlines are arranged in a column, and several columns can be arranged side by side. In FIG. 2A, bitlines 46 and 47 and equalization transistors for the left array 50 are located within the left array 50, and bitlines 48 and 49 and equalization transistors for the right array 52 are located within the right array 52. The bitlines are precharged prior to reading the stored data, in a manner similar to the open bitline architecture.

A read and precharge operation for the folded bitline architecture of FIG. 2A will briefly be described. It is assumed that all bitlines have been precharged to a mid-point potential level $V_{BL}$ between a high and a low logic potential level in a previous operation. During a read operation, one wordline of either the left or right array is driven to access one memory cell connected each bitline, BL0 or BL0* for example, of the respective array, and the corresponding equalization control signal, BLEQ_L or BLEQ_R is turned off. The folded complementary bitlines of the unaccessed array, BL1 and BL1* for example, remain at the precharged mid-point potential level. If a memory cell connected to BL0 is accessed by the driven wordline, then the complementary bitline BL0* remains at the precharged mid-point potential level $V_{BL}$, which is the reference potential level used by sense amplifier 41. Accordingly, the role of each bitline is reversed if a memory cell connected to BL0* is accessed instead of a memory cell connected to BL0. Furthermore, the roles of both folded bitline pairs is reversed if a driven wordline accesses a memory cell connected to either BL1 or BL1*.

Alternatively, the memory cells accessed by both bitlines BL0, BL0* contain complementary data, in which case corresponding wordlines of both complementary cells are driven, and the potential of each pair of complementary bitlines changes in opposite directions, thereby increasing the shift in potential to be detected by the sense amplifier. Since the sense amplifier is a cross-coupled latch circuit, the accessed bitline and its corresponding complementary bitline are driven to opposite logic potential levels after the data has been read out. The bitlines are then precharged again in preparation for the next read operation.

While the folded bitline architecture typically generates less noise than the open bitline architecture, and allows a four-bitline pitch for sense amplifiers, it has drawbacks of its own. In particular, the folded bitline architecture does not allow efficient packing of DRAM cells, typically requiring a larger $8F^2$ cell design as can be seen in FIG. 2B, as compared to the $6F^2$ open bitline layout of FIG. 1B.

Various arrangements have been proposed which combine features of the open and folded bitline architectures. These arrangements offer different levels of compromise between the advantages and disadvantages of both architectures. However, it is believed that further improvements are possible.

Therefore, there is a need to provide a dynamic memory array architecture which operates with reduced noise and is arranged with an efficient packing density to occupy small silicon area.

There is also a need to provide a dynamic memory array architecture with reduced power consumption.

There is also a need to provide an open bitline dynamic memory array architecture permitting a simplified arrangement of sense amplifiers.

There is also a need to provide a method of operating a dynamic memory array architecture having these characteristics.

SUMMARY

It is an object of the present invention to address one or more of the disadvantages of the prior art.

It is another object of the present invention to provide a dynamic memory array having an open bitline architecture, wherein a first bitline coupled to a sense amplifier is adjacent to a second bitline concurrently being held at the bitline precharge voltage.

It is another object of the present invention to provide a dynamic memory array having an open bitline architecture and having logic for selectively coupling each bitline to either a sense amplifier or a reference voltage, such that during each sensing operation some bitlines of the array are sensed while the remaining bitlines of the array are held at the reference voltage.

It is another object of the present invention to provide a method of operating a dynamic memory array having an open bitline architecture by concurrently sensing a bitline of the array and holding an adjacent bitline of the array at a reference voltage.

In one aspect, a dynamic random access memory device has a first array of memory cells arranged in rows and columns. The first array has a first plurality of bitlines. Each bitline is coupled to a column of memory cells in the first array. A second array of memory cells is arranged in rows and columns. The second array has a second plurality of bitlines. Each bitline is coupled to a column of memory cells in the second array. A plurality of sense amplifiers are each selectively connectable in an open bitline configuration to at least one bitline of the first plurality of bitlines and at least one complementary bitline of the second plurality of bitlines. A voltage supply has a voltage $V_{BL}$ corresponding to a bitline precharge voltage. The voltage supply is selectively connectable to each bitline of the first and second pluralities of bitlines. Logic selectively connects each bitline of the first plurality of bitlines and the complementary bitline of the second plurality of bitlines to one of a sense amplifier and the voltage supply during a read operation, such that each bitline connected to the sense amplifier is adjacent to a bitline concurrently connected to the voltage supply.

In a further aspect, for each bitline, an isolation transistor is connected between the bitline and one of the plurality of sense amplifiers for selectively connecting the bitline to the one amplifier. For each bitline, a precharge transistor is connected between the bitline and the voltage supply for selectively connecting the bitline to the voltage supply. The logic is responsive to at least one input signal to activate one of the isolation transistor and the precharge transistor for each bitline.

In a further aspect, the logic is responsive to at least one input signal to: connect every third bitline to the voltage supply; and connect the remaining bitlines to corresponding sense amplifiers.

In a further aspect, the plurality of sense amplifiers is a plurality of pairs of sense amplifiers. The logic selectively couples each pair of sense amplifiers to three bitlines of the plurality of bitlines.

In a further aspect, the logic is responsive to at least one input signal to connect each bitline to one of the sense amplifier and the voltage supply.

In a further aspect, the at least one input signal is indicative of an active wordline on which the read operation is performed.

In a further aspect, each bitline that intersects the active wordline at a memory cell is connected to a sense amplifier in response to the at least one input signal. Each bitline that does not intersect the active wordline at a cell is connected to the voltage supply in response to the at least one input signal.

In an additional aspect, a method of operating a dynamic random access memory array having a plurality of bitlines in an open bitline configuration includes: pre-charging the plurality of bitlines to a reference voltage $V_{BL}$ and connecting a first subset of the plurality of bitlines to respective sense amplifiers while concurrently connecting a second, distinct subset of the plurality of bitlines to a voltage supply having a potential of $V_{BL}$ during a read operation. Each bitline connected to the sense amplifier is adjacent to a bitline concurrently connected to the voltage supply.

In a further aspect, connecting the first and second subsets of the plurality of bitlines further comprises: for each bitline, selectively activating an isolation transistor connected between the bitline and one of the plurality of sense amplifiers in response to at least one input signal for selectively connecting the bitline to the one amplifier; and for each bitline, selectively activating a precharge transistor connected between the bitline and the voltage supply in response to at least one input signal for selectively connecting the bitline to the voltage supply.

In a further aspect, every third bitline is connected to the voltage supply in response to at least one input signal. The remaining bitlines are connected to corresponding sense amplifiers in response to the at least one input signal.

In a further aspect, each pair of sense amplifiers is selectively coupled to three bitlines of the plurality of bitlines.

In a further aspect, the first and second subsets of the plurality of bitlines are connected via logic responsive to at least one input signal.

In a further aspect, the at least one input signal is indicative of an active wordline on which the read operation is performed.

In a further aspect, the first subset of the plurality of bitlines corresponds to bitlines that intersect the active wordline at a memory cell. The second subset of the plurality of bitlines corresponds to bitlines that do not intersect the active wordline at a memory cell.

In an additional aspect, a bitline architecture for a dynamic random access memory array has a plurality of sense amplifiers. A voltage supply has a voltage $V_{BL}$ corresponding to a bitline precharge voltage. A plurality of bitlines are arranged in columns. Each of the plurality of bitlines is selectively connectable in an open bitline configuration to each of the voltage supply and at least one of the plurality of sense amplifiers. Logic selectively connects each of the plurality of bitlines to one of a sense amplifier and the voltage supply during a read operation, such that each bitline connected to the sense amplifier is adjacent to a bitline concurrently connected to the voltage supply.

In a further aspect, for each bitline, an isolation transistor is connected between the bitline and one of the plurality of sense amplifiers for selectively connecting the bitline to the one amplifier. For each bitline, a precharge transistor is connected between the bitline and the voltage supply for selectively connecting the bitline to the voltage supply. The logic is responsive to at least one input signal to activate one of the isolation transistor and the precharge dransistor for each bitline.

In a further aspect, the logic is responsive to at least one input signal to: connect every third bitline to the voltage supply; and connect the remaining bitlines to corresponding sense amplifiers.

In a further aspect, the plurality of sense amplifiers is a plurality of pairs of sense amplifiers. The logic selectively couples each pair of sense amplifiers to three bitlines of the plurality of bitlines.

In a further aspect, the logic is responsive to at least one input signal to connect each bitline to one of the sense amplifier and the voltage supply.

In a further aspect, the at least one input signal is indicative of an active wordline on which the read operation is performed.

In a further aspect, each bitline that intersects the active wordline at a memory cell is connected to a sense amplifier in response to the at least one input signal. Each bitline that does not intersect the active wordline at a cell is connected to the voltage supply in response to the at least one input signal.

Additional and/or alternative features, aspects, and advantages of embodiments of the present invention will become apparent from the following description, the accompanying drawings, and the appended claims.

BRIEF DESCRIPTION OF THE DRAWINGS

FIG. 1A is a schematic diagram of an open bitline DRAM according to a prior art embodiment;

FIG. 1B is a schematic diagram of the DRAM cell layout of the embodiment of FIG. 1A;

FIG. 2A is a schematic diagram of a folded bitline DRAM according to a prior art embodiment;

FIG. 2B is a schematic diagram of the DRAM cell layout of the embodiment of FIG. 2A;

FIG. 3A is a schematic diagram of an open bitline DRAM according to a first embodiment;

FIG. 3B is a schematic diagram of the DRAM cell layout of the embodiment of FIG. 3A;

FIGS. 6-9 are logic circuits for an example of a binary to ternary conversion circuit;

DETAILED DESCRIPTION

Figure 4:
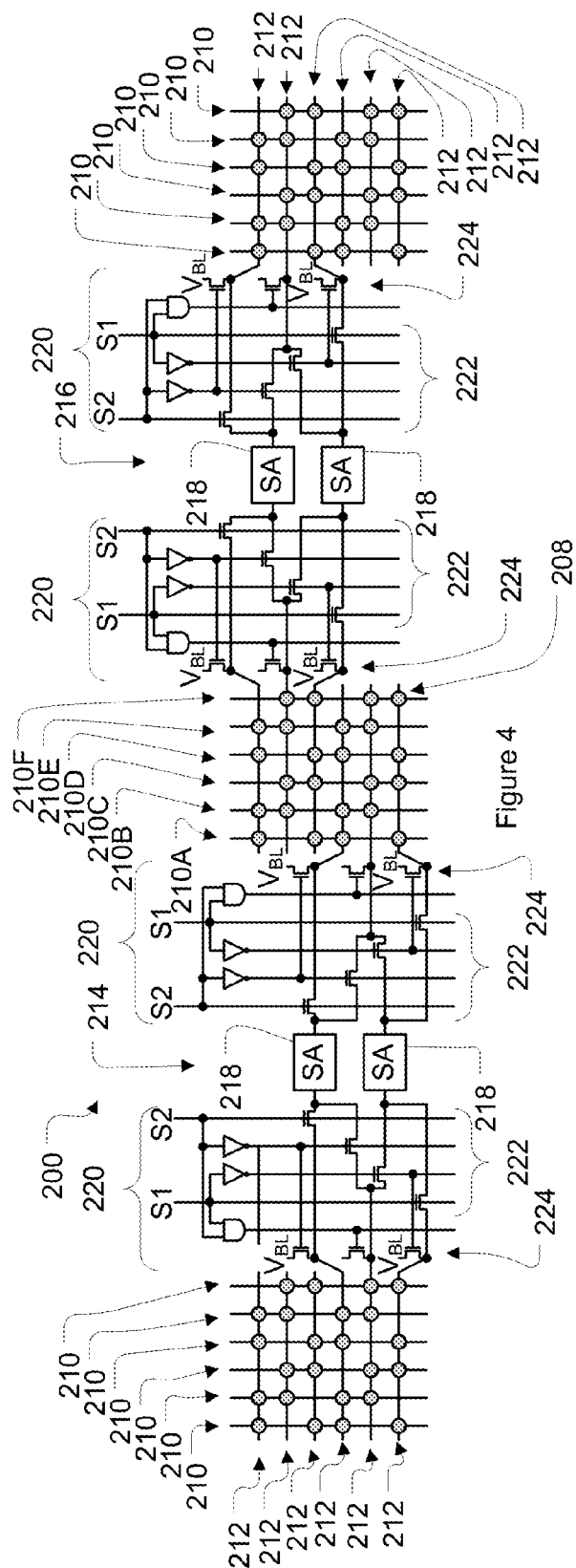
FIG. 4 is a schematic diagram of an open bitline DRAM according to a second embodiment.

Referring to FIGS. 3A and 3B, a dynamic random access memory (DRAM) device 100 will be described according to a first embodiment. FIG. 3A shows three arrays 102, 104, 106 of DRAM cells 108 arranged at the intersections of wordlines 110 and bitlines 112. Two banks 114, 116 of sense amplifiers 118 are disposed between the pairs of arrays 102, 104, 106 and are coupled to the bitlines 112 in an open bitline architecture. Each cell 108 may be a conventional 1T DRAM cell including a single transistor and a capacitor. It should be understood that any number of arrays may be used, by providing a bank of sense amplifiers 118 between each pair of arrays. It should further be understood that the arrays 102, 104, 106 could be scaled to any desired size, by providing the desired number of wordlines 110 and bitlines 112, and an appropriate number of sense amplifiers 118 in each bank corresponding to the number of bitlines 112. All of the arrays 102, 104, 106 in a single DRAM device 100 are typically, but not necessarily, of equal size. It should be understood from FIG. 3B that the DRAM cells 108 of each array 102, 104, 106 are arranged according to a 6F² cell design typical of open bitline architectures, and are more densely packed than the 8F² cell design typical of folded bitline architectures. The DRAM cells 108 of FIG. 3B are staggered with respect to the wordlines, unlike the cells of FIG. 1B which are all arranged on common wordlines, for reasons that will be explained below in further detail.

Figure 5:
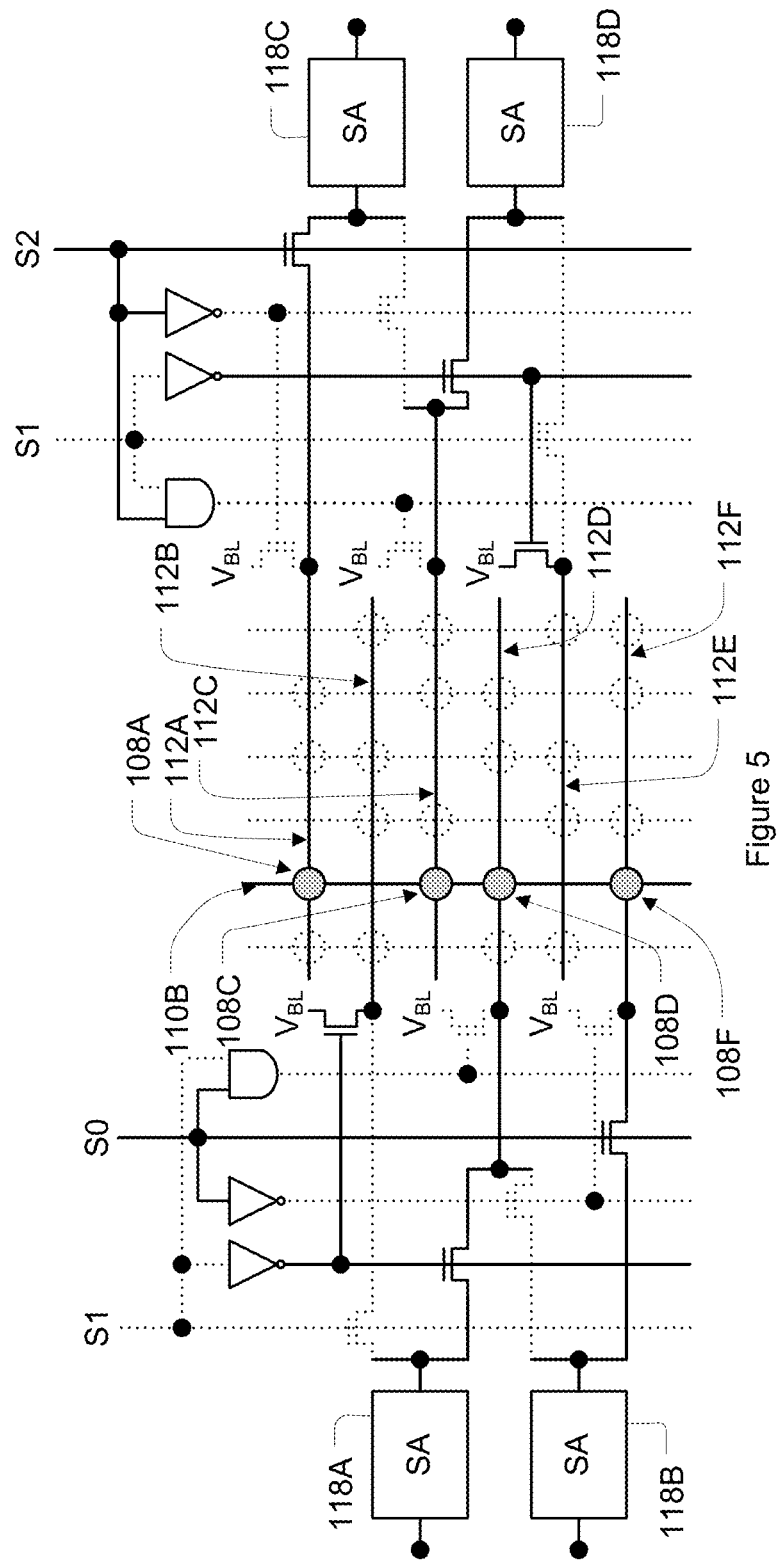
FIG. 5 is a schematic diagram of a single array of the DRAM of FIG. 4, on which a read operation is being performed.
Figure 6:
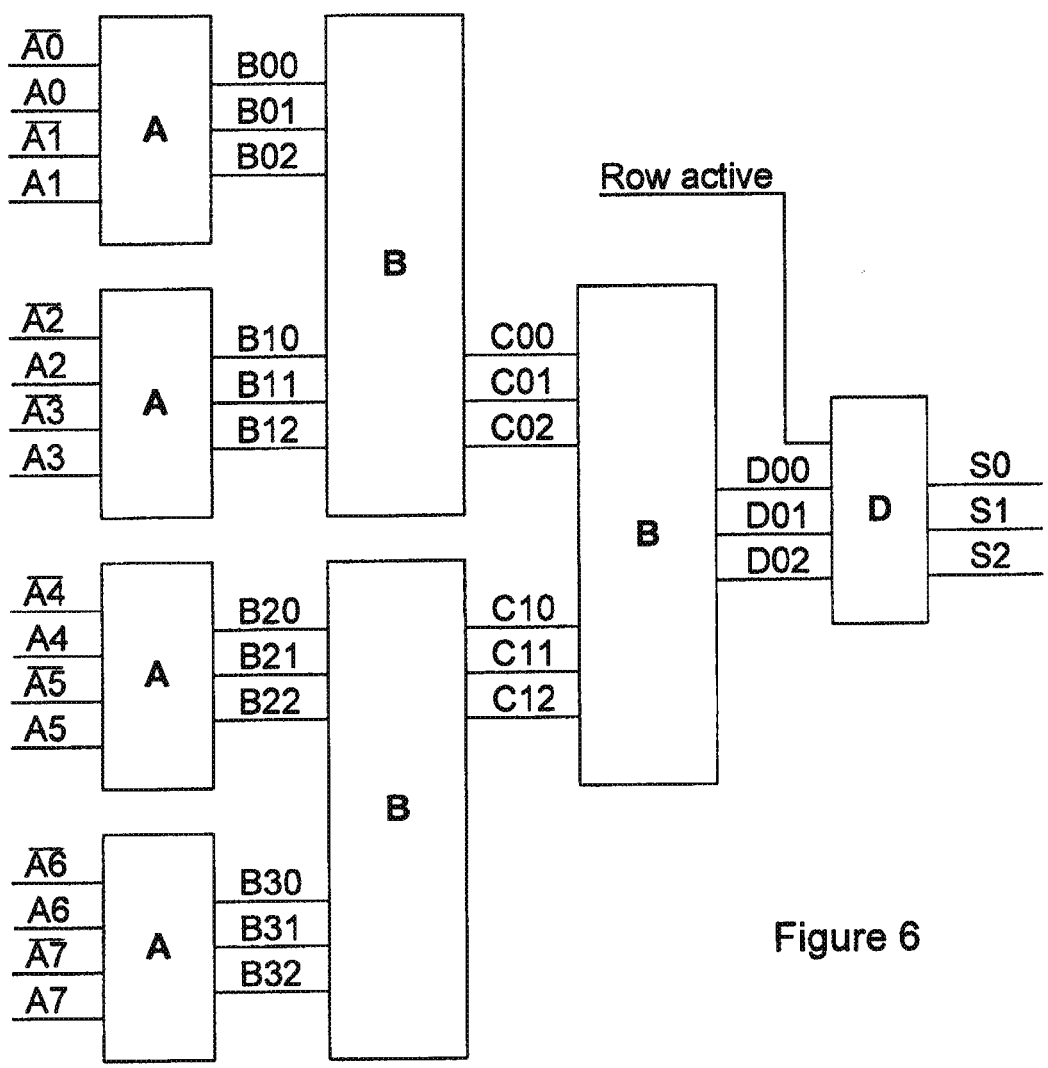
Figure 8:
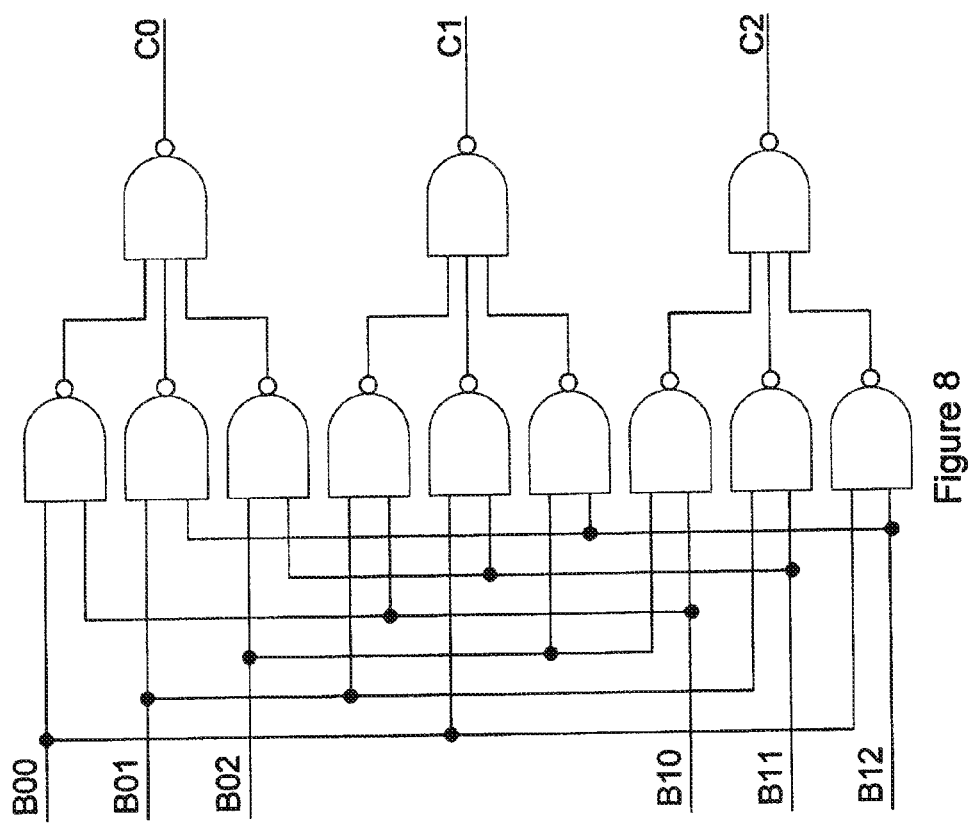

Referring again to FIG. 3A, the bitlines 112 are selectively coupled to the sense amplifiers 118 and a bitline reference voltage supply $V_{BL}$ via logic 120. The logic 120 includes isolation transistors 122 connected between the bitlines 112 and the sense amplifiers 118, and precharge transistors 124 connected between the bitlines 112 and the bitline reference voltage $V_{BL}$. The isolation transistors 122 and the precharge transistors 124 are selectively activated by bitline select signals S0, S1, S2. In this embodiment, in each array a set of three bitlines 112 is coupled to two sense amplifiers 118 via the isolation transistors 122. The layout could be repeated indefinitely to achieve an array 102, 104, 106 of any desired size by providing additional sets of three bitlines 112 and two sense amplifiers 118 connected via the same logic 120. In this embodiment, the bitlines 112 coupled to two pairs of sense amplifiers 118 are interleaved, such that (as best seen in FIG. 5) bitlines 112A, 112C, 112E are coupled to one pair of sense amplifiers 118, and bitlines 112B, 112D, 112F are coupled to another pair of sense amplifiers 118. This is only one of several possible arrangements that should be apparent to persons of ordinary skill in the art, and it should be understood that the logic 120 could be adapted to accommodate any such arrangement. It should be understood that all of the arrays of the DRAM device 100 would have their bitlines 112 coupled to the adjacent banks of sense amplifiers 118 by equivalent logic 120.

Referring now to FIG. 5, a read operation will now be described, with respect to bitlines 112A, 112B, 112C, 112D, 112E, 112F of the array 104. It should be understood that a DRAM read operation takes place along the entire length of the specified wordline 110, and that the remaining bitlines 112 in the array 104 are sensed by the remaining sense amplifiers 118 in a similar manner. It should further be understood that during the read operation on the array 104, each sense amplifier 118 sensing a bitline 112 in the array 104 will also be coupled to a complementary bitline 112 in a neighboring array, as is typical of an open bitline architecture. Some well-known steps in a conventional read operation should be understood by persons of skill in the art and will not be described in detail. It should be understood that read operations on the other arrays 102, 106 would be performed in a similar manner. To perform a read operation, a row address is specified in a conventional manner, to identify the wordline within the array 104 that is to be read. In the illustrated example, the row address of wordline 110B is specified. The bitlines 112 of the array 104 are precharged in a conventional manner to the bitline reference voltage $V_{BL}$, which is typically but not necessarily half of the power supply potential.

Referring to FIGS. 6-9, the row address is additionally used to generate the bitline select signals S0, S1, S2 that are received as inputs by the logic 120. The bitline select signals S0, S1, S2 determine which two bitlines 112 from each set of three bitlines 112 are coupled to the two corresponding sense amplifiers 118 by activating the corresponding isolation transistor 122, and which one bitline 112 from each set of three bitlines 112 is coupled to the bitline reference voltage $V_{BL}$ by activating the corresponding precharge transistor 124, depending on the specified row address. The bitline select signals S0, S1, S2 may be generated in any suitable manner. In the illustrated embodiment, the bitline select signals S0, S1, S2 are a ternary representation of the binary row address modulo 3, which may be generated for example by the binary-to-ternary converter 150 shown in FIGS. 6-9. Each logic unit A (FIG. 7) of the binary-to-ternary converter 150 receives at its input two binary bits (e.g. A0, A1) of the row address and their complements (e.g. $\overline{A0}$, $\overline{A1}$), and outputs a ternary representation (e.g. B00, B01, B02) of that portion of the row address modulo 3. Each logic unit B (FIG. 8) receives at its input the outputs of two logic units A (e.g. B00, B01, B02; B10, B11, B12), and outputs a ternary representation of their sum modulo 3 (e.g. C00, C01, C02). Multiple stages of logic units B may be provided, as needed to process any number of binary address bits and output a single three-bit result D00, D01, D02. Logic unit D (FIG. 9) receives at its input the bits D00, D01, D02 and inverts them when the row active signal is logic high, resulting in a three-bit bitline select signal S0, S1, S2 of which two bits are logic high and one bit is logic low. It should be understood that logic unit D may be omitted, depending on the arrangement of logic gates used in the logic 120. The binary-to-ternary converter 150 is described in further detail in U.S. Pat. No. 5,396,450, which is incorporated by reference herein in its entirety. It should be understood that other suitable methods of generating the bitline select signals S0, Si, S2 would be apparent to persons of ordinary skill in the art. It should additionally be understood that more or fewer bitline select signals could be provided, depending on the periodicity of the bitline connections to the sense amplifiers and the bitline reference voltage $V_{BL}$. For example, if every second bitline 112 is sensed during a read operation and every other bitline 112 is coupled to the bitline reference voltage $V_{BL}$, one select signal representing a single bit would be sufficient to specify which bitline 112 is to be sensed and which bitline 112 is to be coupled to the bitline reference voltage $V_{BL}$.

Figure 10:
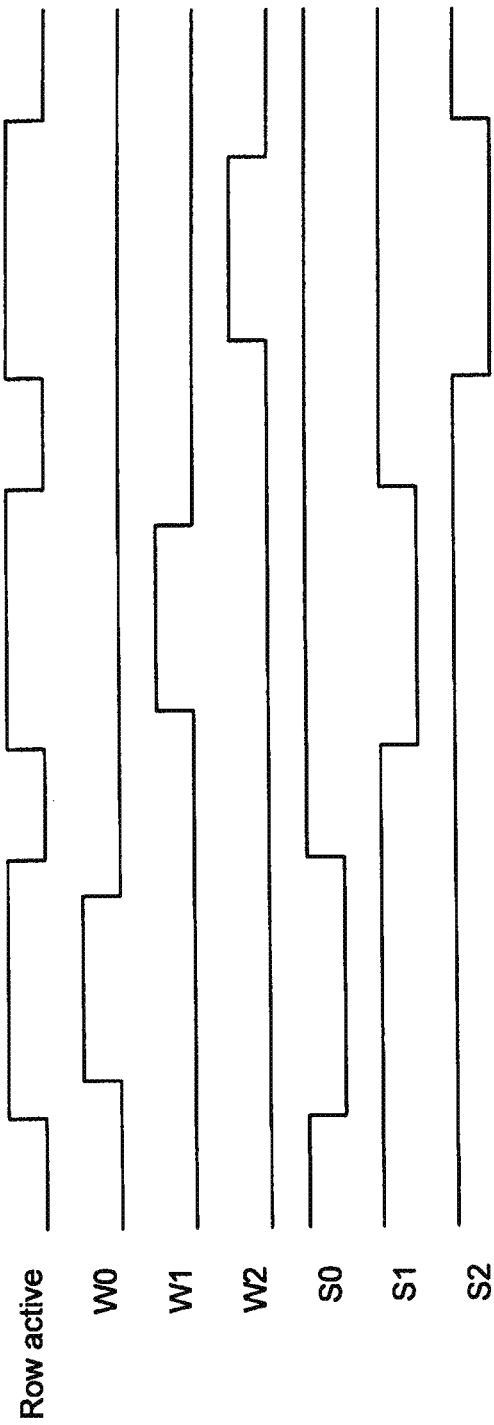
FIG. 10 is a timing diagram according to an embodiment.

In this example, wordline 110B has the binary row address 00000001, which produces the bitline select signals S0=1, S1=0, S2=1. These bitline select signals cause the logic 120 to couple each bitline 112 to either one of the sense amplifiers 118 by activating the corresponding isolation transistor 122, or a voltage supply having the $V_{BL}$ reference potential by activating the corresponding precharge transistor 124, as illustrated graphically in FIG. 5. The bitlines 112A and 112C are sensed by sense amplifiers 118C and 118D, which detect the data stored at cells 108A and 108C. The bitlines 112D and 112F are sensed by sense amplifiers 118A and 118B, which detect the data stored at cells 108D and 108F. The bitlines 112B and 112D, which do not have cells on the wordline 110B due to the staggered cell arrangement of FIG. 3B, are coupled to the $V_{BL}$ reference potential. Referring now to FIG. 10, the bitline select signals S0, S1, S2 corresponding to each active wordline 110 are shown. It should be understood that each set of three bitlines 112 coupled to a pair of sense amplifiers 118 corresponds to the same sequence of bitline select signals S0, S1, S2, and that the logic 120 is configured to respond to the bitline select signals S0, S1, S2 such that the bitlines 112 that intersect the active wordline 110 at a cell 108 are coupled to a sense amplifier 118 while the bitlines 112 that do not intersect the active wordline 110 at a cell 108 are held at the $V_{BL}$ reference potential during the read operation.

In this arrangement, every third bitline 112 in the array 104 is connected to the $V_{BL}$ reference potential during each read operation, such that each bitline 112 currently being sensed by a sense amplifier is adjacent to a bitline 112 currently connected to the $V_{BL}$ reference potential. As a result, each bitline 112 being sensed is adjacent to only one other bitline 112 that is concurrently being sensed, and is shielded from crosstalk on the opposite side by a bitline 112 being held at the $V_{BL}$ reference potential, thereby reducing the crosstalk and the potential for a read error. It should be understood that more or fewer of the bitlines 112 may alternatively be held at the $V_{BL}$ reference potential while fewer or more of the bitlines 112 are being sensed, thereby providing a greater or lesser degree of shielding from crosstalk due to the capacitive coupling between adjacent bitlines 112, with potential trade-offs in the compactness of the array or the complexity of the logic required to appropriately couple the bitlines to the sense amplifiers.

Referring to FIG. 4, a DRAM device 200 will be described according to a second embodiment. Features of the DRAM 200 similar to corresponding features in the DRAM 100 have been given similar numbers, and some will not be described again in detail. The DRAM device 200 has three arrays 202, 204, 206, each having DRAM cells 208 arranged at the intersection between wordlines 210 and bitlines 212. Sense amplifiers 218 are disposed between pairs of arrays 202, 204, 206 and coupled to the bitlines 212 in an open bitline architecture. The cells 208 are arranged in the same staggered $6F^2$ design as the embodiment of FIGS. 3A and 3B.

Referring still to FIG. 4, the bitlines 212 are selectively coupled to the sense amplifiers 218 and a bitline reference voltage supply $V_{BL}$ via logic 220. The logic 220 includes isolation transistors 222 connected between the bitlines 212 and the sense amplifiers 218, and precharge transistors 224 connected between the bitlines 212 and the bitline reference voltage $V_{BL}$. The isolation transistors 222 and the precharge transistors 224 are selectively activated by bitline select signals Si, S2. In this embodiment, in each array a set of three bitlines 212 is coupled to two sense amplifiers 218 via the isolation transistors 222. The layout could be repeated indefinitely to achieve an array 202, 204, 206 of any desired size by providing additional sets of three bitlines 212 and two sense amplifiers 218 connected via the same logic 220. In this embodiment, the bitlines 212 coupled to two pairs of sense amplifiers 218 are grouped together, such that each pair of sense amplifiers 218 is coupled to a set of three adjacent bitlines 212. This is only one of several possible arrangements that should be apparent to persons of ordinary skill in the art, and it should be understood that the logic 220 could be adapted to accommodate any such arrangement. It should be understood that all of the arrays of the DRAM device 200 would have their bitlines 212 coupled to the adjacent banks of sense amplifiers 218 by equivalent logic 220.

The read operation for the device 200 is similar to the read operation for the device 100. It should be understood that during the read operation on the array 204, for example, each sense amplifier 218 sensing a bitline 212 in the array 204 will also be coupled to a complementary bitline 212 in a neighboring array, as is typical of an open bitline architecture. Some well-known steps in a conventional read operation should be understood by persons of skill in the art and will not be described in detail. It should be understood that read operations on the other arrays 202, 206 would be performed in a similar manner. To perform a read operation, a row address is specified in a conventional manner, to identify the wordline within the array 204 that is to be read. The bitlines 212 of the array 204 are precharged in a conventional manner to the bitline reference voltage $V_{BL}$, which is typically but not necessarily half of the power supply potential.

The row address is additionally used to generate the bitline select signals S0, S1, S2 that are received as inputs by the logic 220, for example using the logic shown in FIGS. 6-9 or any other suitable logic. The bitline select signals S0, S1, S2 determine which two bitlines 212 from each set of three bitlines 212 are coupled to the two corresponding sense amplifiers 218 by activating the corresponding isolation transistors 222, and which one bitline 212 from each set of three bitlines 212 is coupled to the bitline reference voltage $V_{BL}$ by activating the corresponding precharge transistors 224, depending on the specified row address. The bitline select signals S0, S1, S2 may be generated in any suitable manner. It should be understood that the logic 220 is configured to respond to the bitline select signals S0, S1, S2 such that the bitlines 212 that intersect the active wordline 210 at a cell 208 are coupled to a sense amplifier 218 while the bitlines 212 that do not intersect the active wordline 210 at a cell 208 are held at the $V_{BL}$ reference potential during the read operation.

In this arrangement, every third bitline 212 in the array 204 is connected to the $V_{BL}$ reference potential during each read operation, such that each bitline 212 currently being sensed by a sense amplifier is adjacent to a bitline 212 currently connected to the $V_{BL}$ reference potential. As a result, each bitline 212 being sensed is adjacent to only one other bitline 212 that is concurrently being sensed, and is shielded from crosstalk on the opposite side by a bitline 212 being held at the $V_{BL}$ reference potential, thereby reducing the crosstalk and the potential for a read error. It should be understood that more or fewer of the bitlines 212 may alternatively be held at the $V_{BL}$ reference potential while fewer or more of the bitlines 212 are being sensed, thereby providing a greater or lesser degree of shielding from crosstalk due to the capacitive coupling between adjacent bitlines 212, with potential trade-offs in the compactness of the array or the complexity of the logic required to appropriately couple the bitlines to the sense amplifiers.

Figure 11:
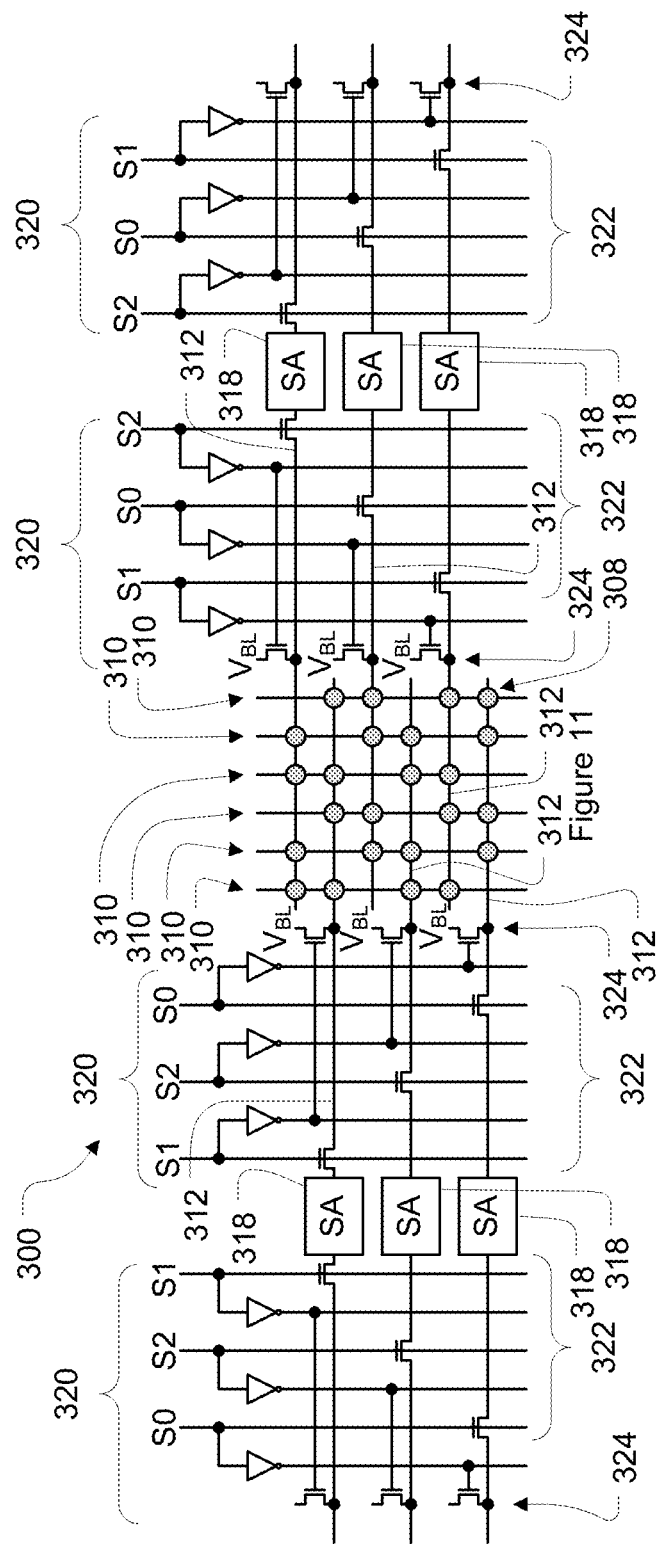
FIG. 11 is a schematic diagram of an open bitline DRAM according to a third embodiment.

Referring to FIG. 11, a DRAM device 300 will be described according to a third embodiment. Features of the DRAM 300 similar to corresponding features in the DRAM 100 have been given similar numbers, and some will not be described again in detail. The DRAM device 300 has multiple arrays of which only the array 204 is shown, each having DRAM cells 308 arranged at the intersection between wordlines 310 and bitlines 312. Sense amplifiers 318 are disposed between pairs of arrays and coupled to the bitlines 312 in an open bitline architecture. The cells 308 are arranged in the same staggered $6F^2$ design as the embodiment of FIGS. 3A and 3B.

Referring still to FIG. 11, the bitlines 312 are selectively coupled to the sense amplifiers 318 and a bitline reference voltage supply $V_{BL}$ via logic 320. In this embodiment, each bitline 312 is coupled to a corresponding sense amplifier 318 via the logic 320. The logic 320 includes isolation transistors 322 connected between the bitlines 312 and the sense amplifiers 318, and precharge transistors 324 connected between the bitlines 312 and the bitline reference voltage $V_{BL}$. The isolation transistors 322 and the precharge transistors 324 are selectively activated by bitline select signals S0, S1, S2. The layout could be repeated indefinitely to achieve an array 304 of any desired size by providing additional sets of three bitlines 312 and three sense amplifiers 318 connected via the same logic 320. In this embodiment, the bitlines 312 coupled to the sense amplifiers 318 on each side of the array 304 are interleaved, such that bitlines 312A, 312C, 312E are coupled to sense amplifiers 318 on one side of the array 304, and bitlines 312B, 312D, 312F are coupled to sense amplifiers 318 on the opposite side of the array 304. This is only one of several possible arrangements that should be apparent to persons of ordinary skill in the art, and it should be understood that the logic 320 could be adapted to accommodate any such arrangement. It should be understood that all of the arrays of the DRAM device 300 would have their bitlines 312 coupled to the adjacent banks of sense amplifiers 318 by equivalent logic 320.

The read operation for the device 300 is similar to the read operation for the device 100. It should be understood that during the read operation on the array 304, for example, each sense amplifier 318 sensing a bitline 312 in the array 304 will also be coupled to a complementary bitline 312 in a neighboring array, as is typical of an open bitline architecture. Some well-known steps in a conventional read operation should be understood by persons of skill in the art and will not be described in detail. It should be understood that read operations on the other arrays would be performed in a similar manner. To perform a read operation, a row address is specified in a conventional manner, to identify the wordline within the array 304 that is to be read. The bitlines 312 of the array 304 are precharged in a conventional manner to the bitline reference voltage $V_{BL}$, which is typically but not necessarily half of the power supply potential.

The row address is additionally used to generate the bitline select signals S0, S1, S2 that are received as inputs by the logic 320, for example using the logic shown in FIGS. 6-9 or any other suitable logic. The bitline select signals S0, S1, S2 determine which two bitlines 312 from each set of three bitlines 312 are coupled to the two corresponding sense amplifiers 318 by activating the corresponding isolation transistor 322, and which one bitline 312 from each set of three bitlines 312 is coupled to the bitline reference voltage $V_{BL}$ by activating the corresponding precharge transistor 324, depending on the specified row address. The bitline select signals S0, S1, S2 may be generated in any suitable manner. It should be understood that the logic 320 is configured to respond to the bitline select signals S0, S1, S2 such that the bitlines 312 that intersect the active wordline 310 at a cell 308 are coupled to a sense amplifier 318 while the bitlines 312 that do not intersect the active wordline 310 at a cell 308 are held at the $V_{BL}$ reference potential during the read operation.

In this arrangement, every third bitline 312 in the array 304 is connected to the $V_{BL}$ reference potential during each read operation, such that each bitline 312 currently being sensed by a sense amplifier is adjacent to a bitline 312 currently connected to the $V_{BL}$ reference potential. As a result, each bitline 312 being sensed is adjacent to only one other bitline 312 that is concurrently being sensed, and is shielded from crosstalk on the opposite side by a bitline 312 being held at the $V_{BL}$ reference potential, thereby reducing the crosstalk and the potential for a read error. It should be understood that more or fewer of the bitlines 312 may alternatively be held at the $V_{BL}$ reference potential while fewer or more of the bitlines 312 are being sensed, thereby providing a greater or lesser degree of shielding from crosstalk due to the capacitive coupling between adjacent bitlines 312, with potential trade-offs in the compactness of the array or the complexity of the logic required to appropriately couple the bitlines to the sense amplifiers. As a result of the improved shielding between adjacent bitlines, without sacrificing the compactness of the cell layout, a number of advantages can be realized. The sensing operation can occur more quickly and reliably due to the absence of crosstalk-induced noise. In addition or in the alternative, it may be possible in some embodiments to sense a smaller stored charge without sacrificing reliability of the read operation, thereby permitting the use of smaller capacitors and potentially resulting in an even more compact arrangement of memory cells. A more rapid detection of a smaller charge may also result in reduced power consumption. In addition, the staggered arrangement of cells may provide reduced power consumption per read operation, because each read operation results in fewer cells being read. In addition, the coupling of three bitlines to two sense amplifiers allows each sense amplifier to occupy a three-bitline pitch, thereby simplifying the sense amplifier layout.

Modifications and improvements to the above-described embodiments of the present invention may become apparent to those skilled in the art. The foregoing description is intended to be by way of example rather than limiting. The scope of the present invention is therefore intended to be limited solely by the scope of the appended claims.

What is claimed is:

1. A dynamic random access memory device, comprising:
   a first array of memory cells arranged in rows and columns, the first array comprising a first plurality of bitlines, each bitline being coupled to a column of memory cells in the first array;
   a second array of memory cells arranged in rows and columns, the second array comprising a second plurality of bitlines, each bitline being coupled to a column of memory cells in the second array;
   a plurality of sense amplifiers, each sense amplifier being selectively connectable in an open bitline configuration to at least one bitline of the first plurality of bitlines and at least one complementary bitline of the second plurality of bitlines;
   a voltage supply having a voltage VBA corresponding to a bitline precharge voltage, the voltage supply being selectively connectable to each bitline of the first and second pluralities of bitlines; and
   logic for selectively connecting each bitline of the first plurality of bitlines and the complementary bitline of the second plurality of bitlines to one of a sense amplifier and the voltage supply during a read operation, such that each bitline connected to the sense amplifier is adjacent to a bitline concurrently connected to the voltage supply, wherein:
   the logic is responsive to at least one input signal to:
      connect every third bitline in the first and second arrays of memory cells to the voltage supply; and
      connect the remaining bitlines in the first and second arrays of memory cells to corresponding sense amplifiers.

2. The dynamic random access memory device of claim 1, wherein the logic comprises:
   for each bitline, an isolation transistor connected between the bitline and one of the plurality of sense amplifiers for selectively connecting the bitline to the one amplifier;
   for each bitline, a precharge transistor connected between the bitline and the voltage supply for selectively connecting the bitline to the voltage supply,
   the logic being responsive to at least one input signal to activate one of the isolation transistor and the precharge transistor for each bitline.

3. The dynamic random access memory device of claim 1, wherein:
   the plurality of sense amplifiers is a plurality of pairs of sense amplifiers; and
   the logic selectively couples each pair of sense amplifiers to three bitlines of the plurality of bitlines.

4. The dynamic random access memory device of claim 1, wherein:
   the logic is responsive to at least one input signal to connect each bitline to one of the sense amplifier and the voltage supply.

5. The dynamic random access memory device of claim 4, wherein:
   the at least one input signal is indicative of an active wordline on which the read operation is performed.

6. The dynamic random access memory device of claim 5, wherein:
each bitline that intersects the active wordline at a memory cell is connected to a sense amplifier in response to the at least one input signal; and
each bitline that does not intersect the active wordline at a cell is connected to the voltage supply in response to the at least one input signal.

7. A method of operating a dynamic random access memory array having a plurality of bitlines in an open bitline configuration, comprising:
pre-charging the plurality of bitlines to a reference voltage $V_{BL}$; and
in response to at least one input signal, connecting a first subset of the plurality of bitlines to respective sense amplifiers while concurrently connecting a second, distinct subset of the plurality of bitlines to a voltage supply having a potential of $V_{BL}$ during a read operation;
such that each bitline connected to the sense amplifier is adjacent to a bitline concurrently connected to the voltage supply,
wherein the second subset of the plurality of bitlines is every third bitline of the plurality of bitlines; and
wherein the first subset of the plurality of bitlines is the remaining bitlines of the plurality of bitlines.

8. The method of claim 7, wherein:
connecting the first and second subsets of the plurality of bitlines further comprises:
for each bitline, selectively activating an isolation transistor connected between the bitline and one of the plurality of sense amplifiers in response to at least one input signal for selectively connecting the bitline to the one amplifier; and
for each bitline, selectively activating a precharge transistor connected between the bitline and the voltage supply in response to at least one input signal for selectively connecting the bitline to the voltage supply.

9. The method of claim 7, further comprising:
selectively coupling each pair of sense amplifiers to three bitlines of the plurality of bitlines.

10. The method of claim 7, wherein:
connecting the first and second subsets of the plurality of bitlines comprises connecting the first and second subsets of the plurality of bitlines via logic responsive to at least one input signal.

11. The method of claim 10, wherein:
the at least one input signal is indicative of an active wordline on which the read operation is performed.

12. The method of claim 11, wherein:
the first subset of the plurality of bitlines corresponds to bitlines that intersect the active wordline at a memory cell; and
the second subset of the plurality of bitlines corresponds to bitlines that do not intersect the active wordline at a memory cell.

13. A bitline architecture for a dynamic random access memory array, comprising:
a plurality of sense amplifiers;
a voltage supply having a voltage VBA corresponding to a bitline precharge voltage;
a plurality of bitlines arranged in columns, each of the plurality of bitlines being selectively connectable in an open bitline configuration to each of the voltage supply and at least one of the plurality of sense amplifiers; and
logic for selectively connecting each of the plurality of bitlines to one of a sense amplifier and the voltage supply during a read operation, such that each bitline connected to the sense amplifier is adjacent to a bitline concurrently connected to the voltage supply,
the logic being responsive to at least one input signal to:
connect every third bitline of the plurality of bitlines to the voltage supply; and
connect the remaining bitlines of the plurality of bitlines to corresponding sense amplifiers.

14. The bitline architecture of claim 13, wherein the logic comprises:
for each bitline, an isolation transistor connected between the bitline and one of the plurality of sense amplifiers for selectively connecting the bitline to the one amplifier;
for each bitline, a precharge transistor connected between the bitline and the voltage supply for selectively connecting the bitline to the voltage supply,
the logic being responsive to at least one input signal to activate one of the isolation transistor and the precharge transistor for each bitline.

15. The bitline architecture of claim 13, wherein:
the plurality of sense amplifiers is a plurality of pairs of sense amplifiers; and
the logic selectively couples each pair of sense amplifiers to three bitlines of the plurality of bitlines.

16. The bitline architecture of claim 13, wherein:
the logic is responsive to at least one input signal to connect each bitline to one of the sense amplifier and the voltage supply.

17. The bitline architecture of claim 16, wherein:
the at least one input signal is indicative of an active wordline on which the read operation is performed.

18. The bitline architecture of claim 17, wherein:
each bitline that intersects the active wordline at a memory cell is connected to a sense amplifier in response to the at least one input signal; and
each bitline that does not intersect the active wordline at a cell is connected to the voltage supply in response to the at least one input signal.

* * * * *